(12) United States Patent
Kanazawa

(10) Patent No.: US 6,317,383 B1
(45) Date of Patent: Nov. 13, 2001

(54) DETECTION CIRCUIT FOR DETECTING TIMING OF TWO NODE SIGNALS

(75) Inventor: Naoki Kanazawa, Tokyo (JP)

(73) Assignee: Kawasaki Steel Corporation, Kobe (JP)

( * ) Notice: Subject to any disclaimer, the term of this patent is extended or adjusted under 35 U.S.C. 154(b) by 0 days.

(21) Appl. No.: 09/534,533

(22) Filed: Mar. 27, 2000

(30) Foreign Application Priority Data

Mar. 29, 1999 (JP) .................................................. 11-085458

(51) Int. Cl.$^7$ ...................................................... G11C 8/00
(52) U.S. Cl. ........................ 365/233.5; 365/194; 365/210
(58) Field of Search ................................ 365/233.5, 210, 365/194

(56) References Cited

U.S. PATENT DOCUMENTS 5,440,182 * 8/1995 Dobbelaere ............................ 326/38
5,715,405 * 2/1998 McClear et al. ..................... 395/280

* cited by examiner

Primary Examiner—Vu A. Le
(74) Attorney, Agent, or Firm—Oliff & Berridge, PLC

(57) ABSTRACT

A detection circuit detects the timings of transitions of two node signals. The detection circuit has two nodes A and B, a P-channel transistor and an N-channel transistor provided between a power supply and a ground so as to be connected in series in the order of the power supply, the P-channel transistor, and the N-channel transistor, and each of the gates thereof is connected to each of the two nodes A and B, and a floating-preventing latch circuit connected to a connection node formed by the P-channel transistor and the N-channel transistor. Particularly, in the detection circuit, the gate of the P-channel transistor is connected to the node A and the gate of the N-channel transistor is connected to the node B in which the two node signals A and B are initially LOW, the node signal A rises to HIGH first, then the node signal B rises to HIGH, the node signals A and B remain HIGH for a predetermined period, the node signal B falls to LOW first, and then the node signal A falls to LOW. Also, a detection circuit for detecting the timing of charge and discharge completion of the bit line for use in a semiconductor memory according to the present invention is provided.

18 Claims, 5 Drawing Sheets

| C | D |
|---|---|
| H | L |
| L | H |

| C | D |
|---|---|
| H | H |
| L | L |

| C | D |
|---|---|
| H | L |
| L | H |

| C | D |
|---|---|
| H | H |
| L | L |

DETECTION CIRCUIT FOR DETECTING TIMING OF TWO NODE SIGNALS

BACKGROUND OF THE INVENTION

1. Field of the Invention

The present invention relates to detection circuits for detecting the transition timings of two node signals, and more particularly relates to a circuit which is preferably used for a semiconductor memory which reads the content of a memory cell connected to a bit line by detecting, subsequent to charging of the bit line, using a sense-amplifier connected to the bit line, whether or not the bit line is discharged, which is a particularly common technology in the semiconductor memory field.

2. Description of the Related Art

Detection circuits for detecting the transition timing of two node signals have been demanded. For example, there is a circuit for detecting, after charging of a bit line, using a sense-amplifier connected to a bit line, whether or not the bit line is discharged, which is applied to a wide range of semiconductor memories, such as a ROM (read only memory), and a RAM (random access memory). In such semiconductor memories, since the number of the sense-amplifiers is smaller than the number of the bit lines due to the limitations of the specification or the layout, and the efficiency, one sense-amplifier is shared among a plurality of bit lines. Accordingly, a column selector is provided in each of the bit lines so that the sense-amplifier reads the content of the memory cell connected to a bit line selected by the column selector.

When, instead of an external signal, an internally generated signal controls the read operation of the content of the memory cell connected to the bit line, the timing of the charging completion of the bit line and the detection timing of the sense-amplifier must be detected. In order to do this, a dummy circuit having a construction equivalent to a memory circuit including a memory cell, a bit line, and a column selector provided in the bit line is provided in a semiconductor memory. Using the timing of the charging completion of the bit line and the detection timing of the sense-amplifier in the dummy circuit by causing the dummy circuit to simulate actions of the memory circuit is a common way to control the read operation of the content of a memory cell.

FIG. 4 shows the dummy circuit provided in a conventional semiconductor memory 400. The semiconductor memory 400 includes a dummy circuit 40 having a memory cell 31, a bit line 32, a column selector 33 provided in the bit line 32, and a sense-inverter 34. The memory cell 31 is provided at the node formed by a word line 1 and the bit line 32, which are components of the semiconductor memory 400.

In the dummy circuit 40, a reading operation of the content stored in a memory cell 31 of a memory circuit is simulated. In this simulated operation, the column selector 33 is switched on, and then the bit line 32, which is connected to an input of the sense-inverter 34, is precharged by a precharge-circuit (not shown). The electric potential of the bit line 32 increases due to the precharging. Accordingly, the input of the sense-inverter 34 becomes HIGH and the output thereof becomes LOW. The timing when the output of sense-inverter 34 becomes LOW is detected as the timing of the charging completion of the bit line 32.

When the word line 1 becomes HIGH, since the memory cell 31 is switched on, the electric charge of the bit line 32 flows via the memory cell 31 to a ground GND. Accordingly, the bit line 32 is discharged, which, via the column selector 33, causes the input of the sense-inverter 34 to be LOW and the output thereof to be HIGH. The timing when the output of the sense-inverter 34 becomes HIGH is detected as the detection timing of the sense-amplifier. Thus, the reading operation of the content stored in the memory cell is controlled by being triggered by those detection timings.

However, when the reading operation of the content stored in the memory cell is controlled by being triggered by the timing of the charging completion of the bit line 32 and the detection timing of the sense-amplifier in the dummy circuit 40, the following problems are encountered.

As shown in FIG. 4, the bit line 32 is divided into two bit line segments 32a and 32b by the column selector 33. Since the bit line segment 32b is connected to the memory cell 31 as well as a plurality of other memory cells, the load capacitance of junctions of the bit line segment 32b is larger than the load capacitance of the bit line segment 32a which is connected to the sense inverter 34. Therefore, the timings of the rising edge and the falling edge of a bit line signal of the bit line segment 32a are different from those of the bit line signal of the bit line segment 32b. The timing differences will be described with reference to FIGS. 4 and 5.

FIG. 5 shows bit line signals of the bit line segments and signals generated based on the bit line signals.

In FIG. 5, a bit line signal A of the bit line segment 32a is input to the sense-inverter 34, a bit line signal B of the bit line segment 32b is input to the column selector 33, and an output signal C is output from the sense-inverter 34.

Since the load capacitance of the junctions of the bit line segment 32b is larger than that of the bit line segment 32a, in the event of precharging, the bit line segment 32b is not fully charged thus having a low electric potential, whereas the bit line segment 32a is already fully charged thus having a high electric potential. As shown in FIG. 5, the timing of the rising edge of the bit line signal B occurs later than that of the bit line signal A. Therefore, when the timing of the charging completion of the bit line 32 is detected at the rising edge of the bit line signal A, in other words, at the falling edge of the output signal C from the sense-inverter 34, although the bit line 32 is not fully charged, the timing of the charging completion of the bit line 32 is detected, which may lead to malfunctioning of the dummy circuit.

On the other hand, when the timing of the charging completion of the bit line 32 and the detection timing of the sense-amplifier is detected at the rising edge and the falling edge of the bit line signal B, respectively, there is no problem of detecting the timing of the charging completion of the bit line 32 at the rising edge of the bit line signal B. However, since the electric charge of the bit line segment 32b is discharged faster than that of the bit line segment 32a, when the memory cell 31 is switched on and the detection timing of the sense-amplifier is detected at the falling edge of the bit line signal B, the detection timing of the sense-amplifier is detected before the bit line signal A becomes LOW, in other words, before the level of an input signal to the sense-amplifier is determined, which may also lead to malfunctioning of the dummy circuit.

In order to prevent such malfunctioning, a dummy circuit having a flip-flop provided in a semiconductor memory is proposed. In this dummy circuit, a signal D shown in FIG. 5 is generated as described below.

FIG. 6 shows a flip-flop 60 provided in the dummy circuit of a conventional semiconductor memory.

A data terminal D of the flip-flop 60 is connected to a power supply $V_{DD}$. The bit line signals B and A are input to a clock terminal CK and a clear terminal CL of the flip-flop 60, respectively.

When a HIGH bit line signal A is input to the clear terminal CL of the flip-flop 60 and the bit line signal B changes from LOW to HIGH, since a HIGH signal is input from the power supply $V_{DD}$ to the data terminal D, a LOW signal D is output from an inverted output terminal $Q_N$ by inverting the HIGH input signal. When the bit line signal A input to the clear terminal CL becomes LOW, the flip-flop 60 is cleared and a HIGH signal D is output from the inverted output terminal $Q_N$. Thus, by causing the flip-flop 60 to generate the signal D shown in FIG. 5, the timing of the charging completion of the bit line 32 is detected at the rising edge of the bit line signal B and the detection timing of the sense-amplifier is detected at the falling edge of the bit line signal A. Malfunctioning caused by timing differences in the transitions of the electric potentials of the bit line segments during the charging and discharging processes are prevented.

Since the flip-flop 60 includes many components, the size of the circuit provided with the flip-flop 60 becomes large. FIG. 7 shows one example of the D-type flip-flop circuit which is used in FIG. 6. In FIG. 7, a NOR circuit includes four transistors, an inverter circuit includes two transistors, and a clocked inverter includes four transistors, which amounts to twenty eight transistors in total. In addition, because of many components of the flip-flop 60, transmission delays among transistors become large thus reducing the reading speed.

SUMMARY OF THE INVENTION

Accordingly, considering the foregoing problems, it is a first object of the present invention to provide a detection circuit for detecting the transition timings of two node signals which achieves a reduced circuit size and faster detection operations. Particularly, it is an object to provide a detection circuit for detecting the transition timings of node signals at a second rising edge or a second falling edge among the signals of two nodes A and B in which the signals of the nodes A and B are initially LOW, the signal of the node A rises to HIGH first, then the signal of the node B rises to HIGH, the signals of the nodes A and B remain HIGH for a predetermined period, the signal of the node B falls to LOW first, and then the signal of the node A falls to LOW. Furthermore, it is an object to provide a circuit for detecting the transition timings of the node signals at a second falling edge or a second rising edge among the signals of the two nodes A and B in which signals of the nodes A and B are initially HIGH, the signal of the node A falls to LOW first, then the signal of the node B falls to LOW, the signals of the nodes A and B remain LOW for a predetermined period, the signal of the node B rises to HIGH first, and then the signal of the node A rises to HIGH.

It is a second object of the present invention to provide a detection circuit for detecting charging and discharging timings of a bit line used in a semiconductor memory, which achieves a reduced circuit size and faster detection operations.

To achieve the first object, according to a first aspect of the present invention, there is provided a detection circuit for detecting the timings of transitions of two node signals. The detection circuit has:
(1) two nodes A and B,
(2) a P-channel transistor and an N-channel transistor provided between a power supply and a ground so as to be connected in series in the order of the power supply, the P-channel transistor, and the N-channel transistor, and each of the gates thereof is connected to each of the two nodes A and B, and
(3) a floating-preventing latch circuit connected to a connection node formed by the P-channel transistor and the N-channel transistor.

Particularly, in the detection circuit for detecting the timings of transitions of two node signals, the gate of the P-channel transistor is connected to the node A and the gate of the N-channel transistor is connected to the node B in which the two node signals A and B are initially LOW, the node signal A rises to HIGH first, then the node signal B rises to HIGH, the node signals A and B remain HIGH for a predetermined period, the node signal B falls to LOW first, and then the node signal A falls to LOW.

Alternatively, in the detection circuit, the gate of the P-channel transistor is connected to the node B and the gate of the N-channel transistor is connected to the node A in which the two node signals A and B are initially HIGH, the node signal A falls to LOW first, then the node signal B falls to LOW, the two node signals A and B remain LOW for a predetermined period, the node signal B rises to HIGH first, and then the node signal A rises to HIGH.

To achieve the second object, according to a second aspect of the present invention, there is provided a semiconductor memory has a bit line extending, via a column selector, between a memory cell and a sense-amplifier, for reading the content of the memory cell connected to the bit line by causing the sense-amplifier to detect whether the bit line is discharged after charging of the bit line, the semiconductor memory has:
(1) a dummy circuit having a memory cell, a bit line, and a column selector provided in the bit line for detecting the timing of charging completion and the detection timing by the sense-amplifier,
(2) a P-channel transistor and an N-channel transistor provided in series between a power supply and a ground in the order of, the power supply, the P-channel transistor, and the N-channel transistor, each gate of the P-channel transistor and the N-channel transistor being connected to each of two bit line segments of the bit line divided by the column selector, and
(3) a floating-preventing latch circuit connected to a connection node formed by the P-channel transistor and the N-channel transistor.

Since the detection circuit according to the present invention detects the timing of charging completion of the bit line at the second rising edge among the bit line signals, charging completion timing is detected after the electric charge of a bit line segment among the bit line segments having a larger load capacitance is fully charged. Since the detection circuit detects the detection timing of the sense-amplifier at the second falling edge among the bit line signals, the detection timing of the sense-amplifier is detected after the electric charge of a bit line segment among the bit line segments having a smaller load capacitance is fully discharged. Therefore, in order to prevent malfunctioning caused by timing differences in the transitions of the electric potentials of the bit line segments in the charging and discharging process, the detection circuit is constructed only by a single inverter, formed by the P-channel transistor and the N-channel transistor, and by the floating-preventing latch circuit. Compared with the conventional detection circuit having the flip-flop provided in the semiconductor memory, a reduced circuit size and faster detection operations are achieved.

Other and further aspects of the present invention will become apparent during the course of the following description and by reference to the accompanying drawings.

DESCRIPTION OF THE PREFERRED EMBODIMENTS

Figure 1A:
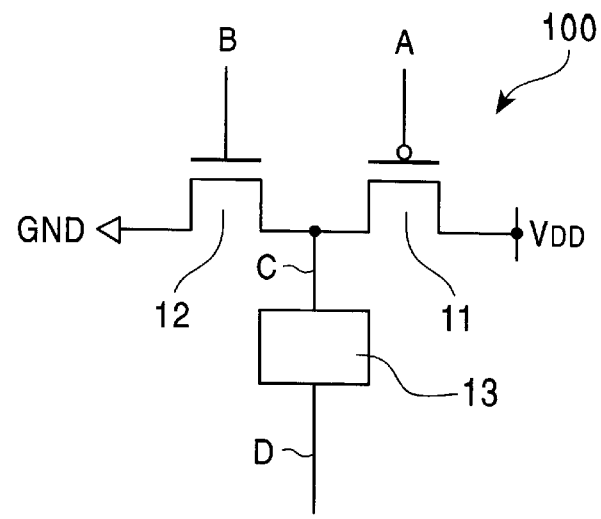
FIG. 1A is a circuit diagram of a circuit for detecting the transition timings of signals of two nodes according to an embodiment of the present invention.
Figure 1B:
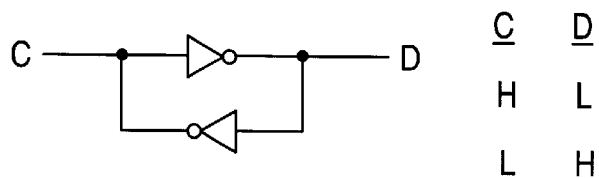
FIGS. 1B and 1C are circuit diagrams of alternative latch circuits for the circuit shown in FIG. 1A.

FIG. 1A shows a detection circuit 100 for detecting transition timings of signals of two nodes A and B according to the present invention; FIGS. 1B and IC show alternative latch circuits 13 for the circuit shown in FIG. 1A; and FIG. 1D shows a timing chart of transitions of node signals of the detection circuit 100 shown in FIG. 1A.

The detection circuit 100 is provided with a P-channel transistor 11 and an N-channel transistor 12 in series between a power supply $V_{DD}$ and a ground GND in the order: the power supply $V_{DD}$, the P-channel transistor 11, and the N-channel transistor 12. The gates of the P-channel transistor 11 and the N-channel transistor 12 are connected to nodes A and B, respectively.

Figure 1C:
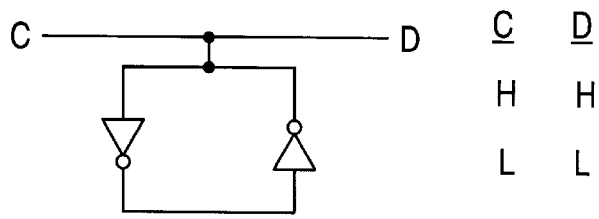

A latch circuit 13 for preventing floating is provided at the node formed by the P-channel transistor 11 and the N-channel transistor 12. There are two alternative latch circuits for the detection circuit 100: one latch circuit shown in FIG. 1B inverts an input signal and outputs it; and the other latch circuit shown in FIG. 1C simply holds an input signal. Operations of the detection circuit 100 having the above construction will be described with reference to FIGS. 1A to 1D.

Figure 1D:
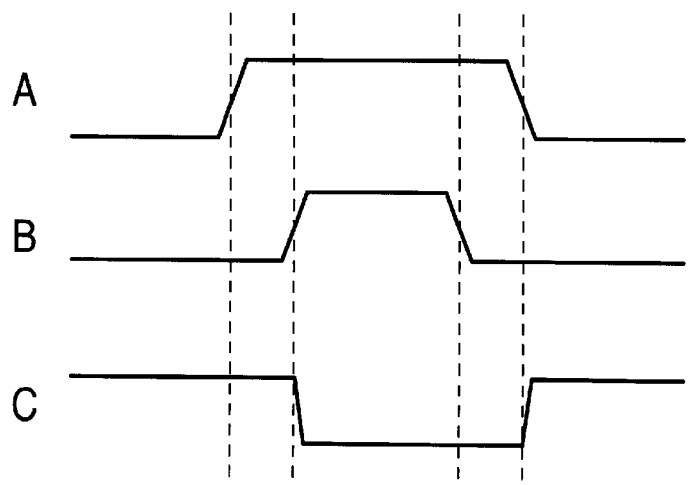
FIG. 1D is a timing chart of transitions of node signals of the circuit shown in FIG. 1A.

In the detection circuit 100, the signals of the nodes A and B are initially LOW as shown in FIG. 1D. Because of this, the P-channel transistor 11 is switched on and the N-channel transistor 12 is switched off, which causes a HIGH signal to be input to the latch circuit 13. The latch circuit 13 outputs either a HIGH or LOW signal as a signal D based on the above-described type of latch circuit 13.

When the signal of the node A rises from LOW to HIGH and the signal of the node B is LOW, a HIGH signal A is input to the gate of the P-channel transistor 11 while a LOW signal B is still input to the gate of the N-channel transistor 12. Accordingly, the P-channel transistor 11 and the N-channel transistor 12 are switched off, which causes the node formed by the P-channel transistor 11 and the N-channel transistor 12 to float. In spite of the floating state of the node, the latch circuit 13 maintains the signal C at HIGH. When shortly thereafter the signal of the node B rises to HIGH from LOW, the N-channel transistor 12 is switched on, thus inputting a LOW signal to the latch circuit 13. Accordingly, the input signal C to the latch circuit 13 transits from HIGH to LOW. Thus, a transition timing is detected at the second rising edge among the two node signals.

When the signal of the node B falls to LOW from HIGH and the signal of the node A is maintained at HIGH, the P-channel transistor 11 remains off while the N-channel transistor 12 is switched off. Although the node formed by the P-channel transistor 11 and the N-channel transistor 12 becomes floating, the latch circuit 13 maintains the input signal C at LOW. When shortly thereafter the signal of the node A falls from HIGH to LOW, the P-channel transistor 11 is switched on, thus inputting a HIGH signal to the latch circuit 13. Accordingly, the input signal C to the latch circuit 13 transits from LOW to HIGH. Thus, a transition timing is detected at the second falling edge among the two signals.

Therefore, since the main circuit of the detection circuit 100 is constructed only by a single inverter, formed by the P-channel transistor 11 and the N-channel transistor 12, and by the latch circuit 13 for preventing floating, reduction of the size of the detection circuit 100 and faster detection operations are achieved, compared with a conventional detection circuit having a flip-flop provided in a semiconductor memory.

Figure 2A:
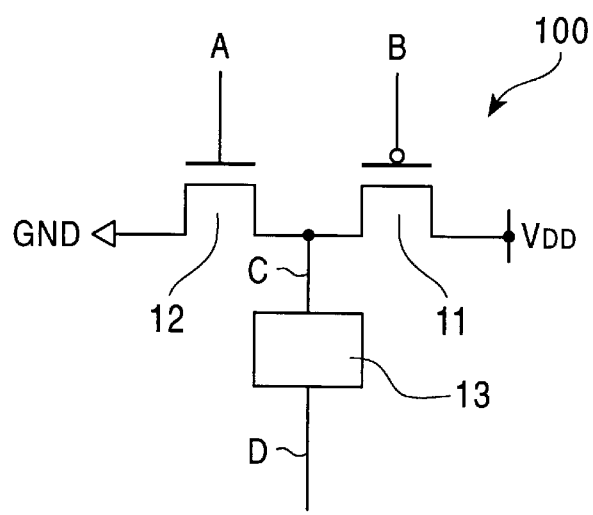
FIG. 2A is a circuit diagram of a circuit for detecting the transition timings of signals of two nodes according to an embodiment of the present invention.
Figure 2B:
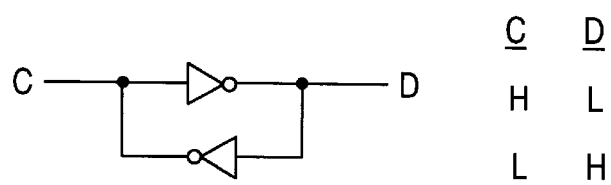
FIGS. 2B and 2C are circuit diagrams of alternative latch circuits for the circuit shown in FIG. 2A.
Figure 2C:
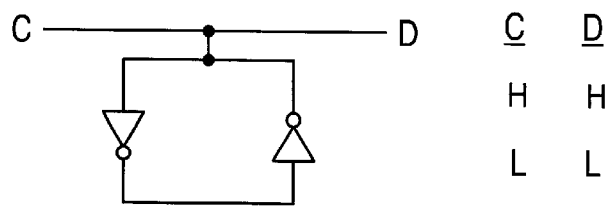
Figure 2D:
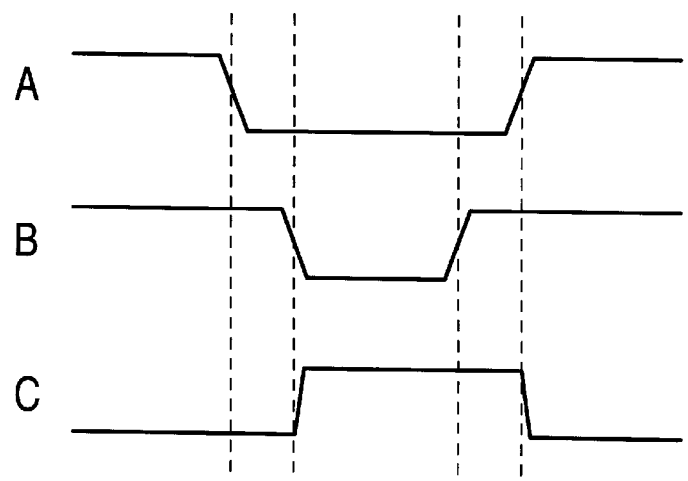
FIG. 2D is a timing chart of transitions of node signals of the circuit shown in FIG. 2A.

FIGS. 2A, 2B, and 2C show a detection circuit for detecting a transition timing of two node signals according to the present invention and alternative latch circuits for the detection circuit shown in FIG. 2A. FIG. 2D shows a timing chart of transitions of node signals of the detection circuit 100 shown in FIG. 2A. As shown in FIG. 2D, transition timings at each node of the detection circuit 100 are different from those shown in FIG. 1D. Namely, in FIG. 2D, the signals of the nodes A and B are initially HIGH, the signal of the node A falls to LOW first, then the signal of the node B falls to LOW, both signals are maintained at LOW for a predetermined period, the signal of the node B rises to HIGH first, and then the signal of the node A rises to HIGH. As shown in FIG. 2A, the node B is connected to the gate of the P-channel transistor 11 and the node A is connected to the gate of the N-channel transistor 12. Since, aside from that, components of both detection circuits in FIGS. 1A and 2A are identical, components in FIG. 2A have the same reference numerals as the corresponding components in FIG. 1A. Since operations and the outline of the detection circuit in FIG. 2A are the same as shown in FIG. 1A, the description thereof is omitted.

Figure 3A:
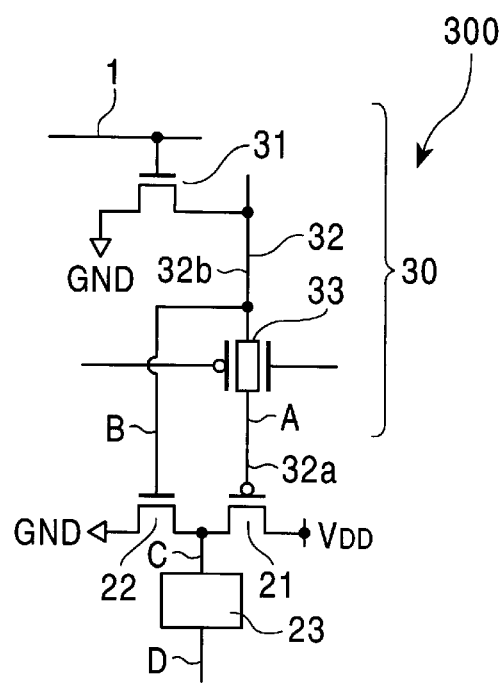
FIG. 3A is a circuit diagram of a circuit for detecting charging and discharging timings of a bit line for the use in a semiconductor memory according to an embodiment of the present invention.
Figure 3B:
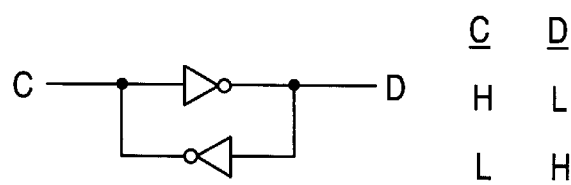
FIGS. 3B and 3C are circuit diagrams of alternative latch circuits for the circuit shown in FIG. 3A.
Figure 3C:
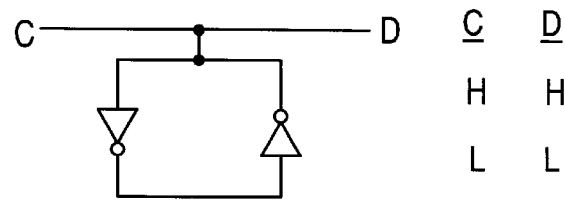
Figure 3D:
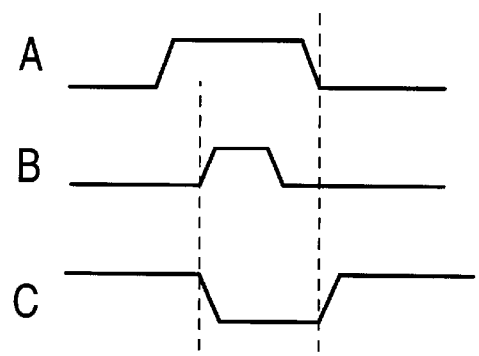
FIG. 3D is a timing chart of transitions of node signals of the circuit shown in FIG. 3A.
Figure 4:
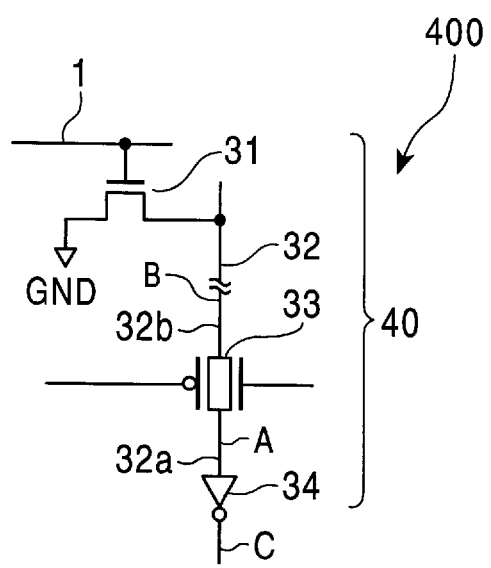
FIG. 4 is a circuit diagram of a flip-flop for the use in a dummy circuit provided in a conventional semiconductor memory.
Figure 5:
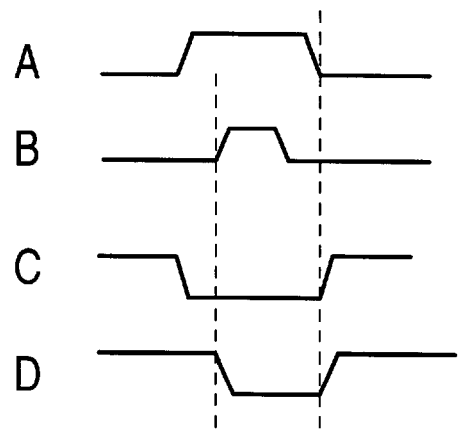
FIG. 5 is a timing chart of bit line signals of two segments obtained by dividing the bit line at a column selector shown in FIG. 4 and signals generated based on the above bit line signals.
Figure 6:
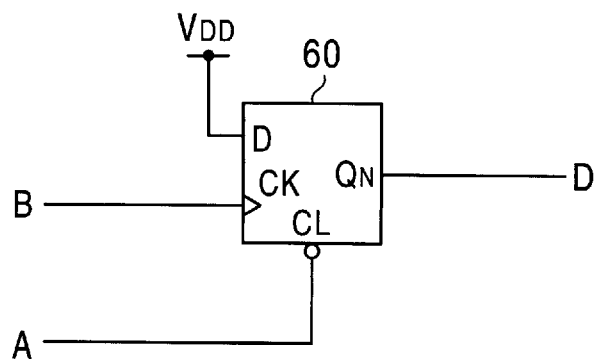
FIG. 6 is a diagram of a D-type flip-flop for use of the dummy circuit provided in the semiconductor memory.
Figure 7:
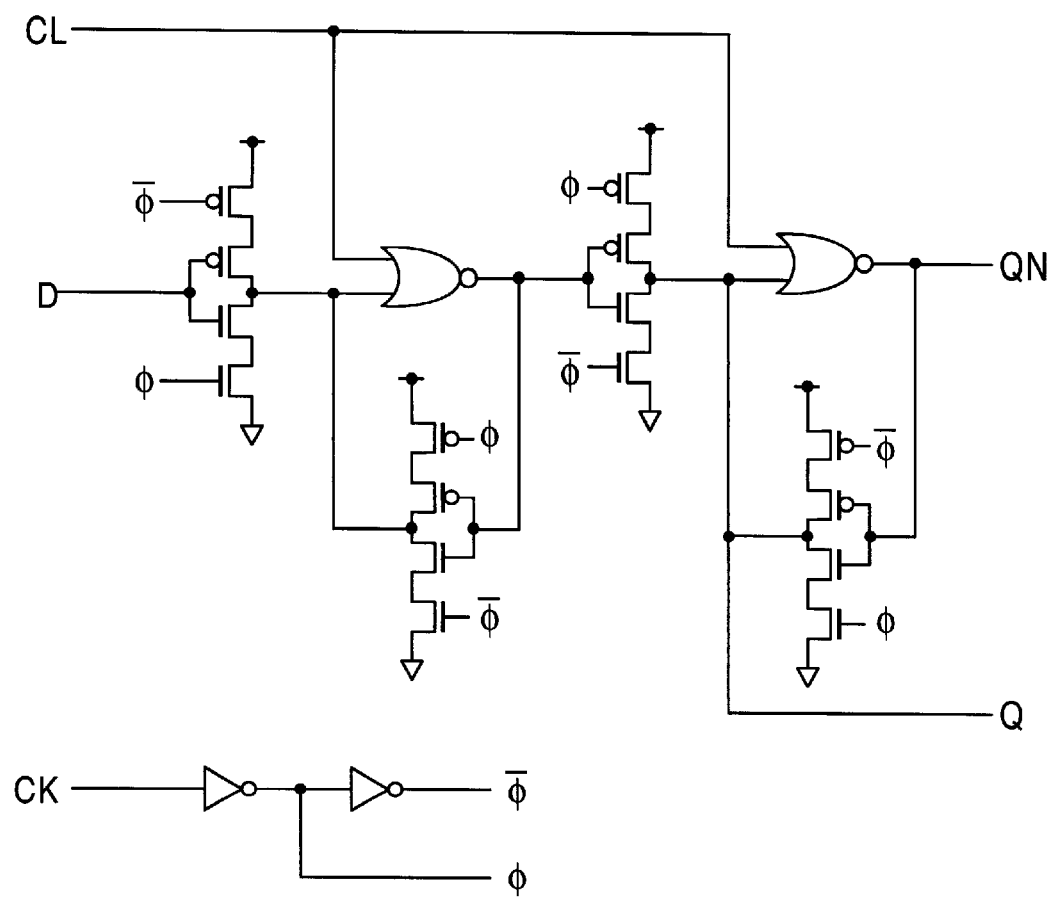
FIG. 7 is a circuit diagram of one example of the D-type flip-flop shown in FIG. 6.

FIG. 3A shows a detection circuit 300 for detecting charging and discharging timings of a bit line used in the semiconductor memory according to the present embodiment. There are two alternative latch circuits 23 for the detection circuit 300: one latch circuit shown in FIG. 3B inverts an input signal and outputs it; and the other latch circuit shown in FIG. 3C simply holds an input signal. FIG. 3D is a timing chart of transitions of the signals of each node in the detection circuit 300 shown in FIG. 3A. When a component in FIG. 3A is identical to the corresponding component in FIG. 4, the component has the same reference numeral as the corresponding one in FIG. 4.

In FIG. 3A, the detection circuit 300, for detecting the timing of the charging completion and the detection timing of the sense-amplifier, includes a dummy circuit 30 having a memory cell 31, a bit line 32, and a column selector 33 provided in the bit line 32. The bit line 32 is divided by the column selector 33 into bit line segments 32a and 32b.

The detection circuit 300 is provided with a P-channel transistor 21 and an N-channel transistor 22 connected in series between the power supply $V_{DD}$ and the ground GND. Each gate of the P-channel transistor 21 and the N-channel transistor 22 is connected to the bit line segments 32a and 32b, respectively.

The node formed by the P-channel transistor 21 and the N-channel transistor 22 is connected to a floating-preventing latch circuit 23. Operations of the detection circuit 300 will be described.

In FIG. 3D, a bit line signal A is input to the bit line segment 32a, a bit line signal B is input to the bit line segment 32b, and a signal C is input to the latch circuit 23.

When the semiconductor memory is reset at an initial stage, as shown in FIG. 3D, the bit line signals A and B are LOW. Accordingly, the P-channel transistor 21 is switched on, and the N-channel transistor 22 is switched off thereby inputting a HIGH input signal to the latch circuit 23. Therefore, the latch circuit 23 outputs either a HIGH or LOW output signal as a signal D based on the type of the latch circuit 23 for preventing floating, as described above.

Operations will be described in a case in which the timing of the charging completion is detected. When the column selector 33 is switched on and the bit line 32 starts to be precharged, the electric potential of the bit line 32 increases. Since the load capacitance of junctions in the bit line segment 32b is larger than that of the bit line segment 32a, the electric potential of the node in the bit line segment 32a increases faster than that in the bit line segment 32b. Therefore, the HIGH bit line signal A is input to the gate of the P-channel transistor 21 while the LOW bit line signal B is still input to the gate of the N-channel transistor 22. The P-channel transistor 21 and the N-channel transistor 22 are switched off, which causes the node formed by the P-channel transistor 11 and the N-channel transistor 12 to be floating. In spite of the floating state, the input signal C to the latch circuit 23 remains HIGH. Shortly thereafter, when the bit line 32 is fully precharged thus increasing the electric potential of the bit line segment 32b, the bit line signal B changes from LOW to HIGH. The N-channel transistor 22 is switched on and the LOW signal is input to the latch circuit 23, whereby the input signal C to the latch circuit 23 changes from HIGH to LOW. Thus, the timing of charging completion of the bit line 32 is detected after the bit line 32 is fully charged.

Operations will be described in a case in which the detection timing of the sense-amplifier is detected. When a word-line 1 becomes HIGH, the electric charge of the bit line 32 flows via the memory cell 31 to a ground GND, thereby discharging the electric charge of the bit line 32. Since the electric charge of the bit line segment 32b is discharged faster than that of the bit line segment 32a, as shown in FIG. 2D, the bit line signal B is switched from HIGH to LOW while the bit line signal A remains HIGH. Accordingly, the P-channel transistor 21 remains off while the N-channel transistor 22 is switched off, which causes the node formed by the P-channel transistor 21 and the N-channel transistor 22 to be floating. In spite of the floating state, the input signal C to the latch circuit 23 remains LOW. Shortly thereafter, when the electric charge of the bit line 32 is fully discharged, the bit line signal A changes from HIGH to LOW. Since the P-channel transistor 21 is switched on, thereby inputting a HIGH signal to the latch circuit 23, the signal C to the latch circuit 23 changes from LOW to HIGH. Thus, the detection timing of the sense-amplifier is detected when the electric charge of the bit line 32 is fully discharged.

As described above, since the detection circuit 300 detects the timing of charging completion of the bit line 32 at the second rising edge among the bit line signals A and B, i.e., the bit line signal B, charging completion timing is detected after the electric charge of a bit line segment among the bit line segments 32a and 32b having a larger load capacitance, i.e., the bit line segment 32b, is fully charged. Since the detection circuit 300 detects the detection timing of the sense-amplifier at the second falling edge among the bit line signals A and B, i.e., the bit line signal A, the detection timing of the sense-amplifier is detected after the electric charge of a bit line segment among the bit line segments 32a and 32b having a smaller load capacitance, i.e., the bit line segment 32a, is fully discharged. Therefore, in order to prevent malfunctioning caused by timing differences in the transitions of the electric potentials of the bit line segments in the charging and discharging process, the detection circuit 300 is constructed only by a single inverter, formed by the P-channel transistor 21 and the N-channel transistor 22, and by the latch circuit 23 for preventing floating. Compared with the conventional detection circuit having the flip-flop provided in the semiconductor memory, a reduced circuit size and faster detection operations are achieved.

As described above, the detection circuit for detecting timings of a charging and discharging circuit of the bit line used in a semiconductor memory has been described as embodiments of the present invention. However, the present invention is not limited to the above embodiments. Different applications of the present invention can be made without departing from the spirit and scope thereof.

What is claimed is:

1. A detection circuit for detecting the timings of transitions of two node signals comprising:

a first node and a second node;

a P-channel transistor and an N-channel transistor provided between a power supply and a ground so as to be connected in series in the order of said power supply, said P-channel transistor, and said N-channel transistor, and each of the gates thereof is connected to each of said first node and said second node; and a floating-preventing latch circuit connected to a connection node formed by said P-channel transistor and said N-channel transistor.

2. A detection circuit according to claim 1, wherein said floating-preventing latch circuit is a circuit which inverts an input signal and outputs the inverted signal.

3. A detection circuit according to claim 1, wherein said floating-preventing latch circuit is a circuit which holds the level of the connection node signal.

4. A detection circuit according to claim 1, wherein the gate of said P-channel transistor is connected to said first node and the gate of said N-channel transistor is connected to said second node in which the two node signals at the first and second nodes are initially LOW, the node signal at said first node rises to HIGH first, then the node signal at said second node rises to HIGH, the node signals at the first and second nodes remain HIGH for a predetermined period, the node signal at said second node falls to LOW first, and then the node signal at said first node falls to LOW.

5. A detection circuit according to claim 4, wherein said floating-preventing latch circuit is a circuit which inverts an input signal and outputs the inverted signal.

6. A detection circuit according to claim 4, wherein said floating-preventing latch circuit is a circuit which holds the level of the connection node signal.

7. A detection circuit according to claim 1, wherein the gate of said P-channel transistor is connected to said second node and the gate of said N-channel transistor is connected to said first node in which the two node signals at the first and second nodes are initially HIGH, the node signal at said first node falls to LOW first, then the node signal at said second node falls to LOW, the two node signals at the first and second nodes remain LOW for a predetermined period, the node signal at said second node rises to HIGH first, and then the node signal at said first node rises to HIGH.

8. A detection circuit according to claim 7, wherein said floating-preventing latch circuit is a circuit which inverts an input signal and outputs the inverted signal.

9. A detection circuit according to claim 7, wherein said floating-preventing latch circuit is a circuit which holds the level of the connection node signal.

10. A semiconductor memory, having a bit line extending, via a column selector, between a memory cell and a sense-amplifier, for reading the content of the memory cell connected to said bit line by causing said sense-amplifier to detect whether said bit line is discharged after charging of said bit line, said semiconductor memory comprising a detection circuit for detecting the timings of charging and discharging of said bit line, said detection circuit comprising:

a dummy circuit having a dummy memory cell, a dummy bit line, and a dummy column selector provided in said dummy bit line for detecting the timing of charging completion and the detection timing by said sense-amplifier;

a P-channel transistor and an N-channel transistor provided in series between a power supply and a ground in the order of, said power supply, said P-channel transistor, and said N-channel transistor, each gate of said P-channel transistor and said N-channel transistor being connected to each of two dummy bit line segments of said dummy bit line divided by said dummy column selector; and a floating-preventing latch circuit connected to a connection node formed by said P-channel transistor and said N-channel transistor.

11. A semiconductor memory according to claim 10, wherein the gate of said P-channel transistor is connected to one of said two dummy bit line segments which is connected to said dummy memory cell while the gate of said N-channel transistor is connected to the other one of said two dummy bit line segments which is not connected to said dummy memory cell.

12. A semiconductor memory according to claim 11, wherein said floating-preventing latch circuit is a circuit which inverts an input signal and outputs the inverted signal.

13. A semiconductor memory according to claim 11, wherein said floating-preventing latch circuit is a circuit which holds the level of the connection node signal.

14. A semiconductor memory according to claim 10, wherein said semiconductor memory is one of a read only memory and a random access memory.

15. A detection circuit for detecting the timings of charging and discharging completion of a bit line for use in a memory, comprising:

at least one bit line;

a column selector provided in said at least one bit line;

at least one memory cell connected to either of two bit line segments of said at least one bit line divided by said column selector;

a P-channel transistor and an N-channel transistor provided between a power supply and a ground in series in the order of, said power supply, said P-channel transistor, and said N-channel transistor, each of the P-channel transistor and the N-channel transistor being connected to each of said two bit line segments; and a floating-preventing latch circuit connected to a connection node formed by said P-channel transistor and said N-channel transistor.

16. A detection circuit according to claim 15, wherein the gate of said P-channel transistor is connected to one of said two bit line segments which is connected to said memory cell while the gate of said N-channel transistor is connected to the other one of said two bit line segments which is not connected to said memory cell.

17. A detection circuit according to claim 16, wherein said floating-preventing latch circuit is a circuit which inverts an input signal and outputs the inverted signal.

18. A detection circuit according to claim 16, wherein said floating-preventing latch circuit is a circuit which holds the level of the connection node signal.

* * * * *